United States Patent
Saeki (12) 
(10) Patent No.: US 6,338,626 B1
(45) Date of Patent: Jan. 15, 2002

(54) LOAD-LOCK MECHANISM AND PROCESSING APPARATUS

(75) Inventor: Hiroaki Saeki, Shirane-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/508,269

(22) PCT Filed: Sep. 10, 1998

(86) PCT No.: PCT/JP98/04084

§ 371 Date: Aug. 10, 2000

§ 102(e) Date: Aug. 10, 2000

(87) PCT Pub. No.: WO99/13504

PCT Pub. Date: Mar. 18, 1999

(30) Foreign Application Priority Data

Sep. 10, 1997 (JP) ............................................. 9-262679

(51) Int. Cl.[7] ................................................. F27D 3/12
(52) U.S. Cl. ....................... 432/243; 432/242; 414/217; 118/50
(58) Field of Search ................................ 432/239, 242, 432/243; 414/217, 938, 939; 118/50, 719

(56) References Cited

U.S. PATENT DOCUMENTS

| | | | |
|---|---|---|---|
| 5,314,574 A | * 5/1994 | Takahashi | 118/719 |
| 5,512,320 A | 4/1996 | Turner et al. | |
| 5,909,994 A | 6/1999 | Blum et al. | |
| 6,059,507 A | * 5/2000 | Adams | 414/217.1 |
| 6,079,928 A | * 6/2000 | Theriault et al. | 414/217 |
| 6,254,328 B1 | * 7/2001 | Wytman | 414/217 |
| 6,270,582 B1 | * 8/2001 | Rivkin et al. | 414/217 |

FOREIGN PATENT DOCUMENTS

| | | |
|---|---|---|
| JP | 3-136345 | 6/1991 |
| JP | 06-97260 | 4/1994 |
| JP | 6-244124 | 9/1994 |
| JP | 9-213764 | 8/1997 |

OTHER PUBLICATIONS

PCT Notification of Transmittal of Copies of Translation of the International Preliminary Examination Report (PCT/IB/338).
International Preliminary Examination Report (PCT/IPEA/409) (translated) for PCT/JP98/04084.

* cited by examiner

*Primary Examiner*—Gregory Wilson
(74) *Attorney, Agent, or Firm*—Smith, Gambrell & Russell, LLP (57) ABSTRACT

A load-lock mechanism according to the invention comprises a vacuum chamber 31 arranged between a vacuum first transferring chamber 20 and atmospheric second transferring chambers 40. The vacuum chamber 31 has a first opening 31A facing the first transferring chamber 20, a vertical pair of second openings 31B facing the second transferring chambers 40 and open-close mechanisms 34A, 34B to open and close each of the second opening 31B. One vertical pair of load-lock chambers 32, 33 are movably housed in the vacuum chamber 31. The supply-discharge passageways 31G, 31H are provided in the vacuum chamber 31 to supply and discharge air into and out of each of the load-lock chambers 32, 33. Each of the load-lock chamber 32, 33 has a first port 32A, 33A which can communicate with the first opening 31A, a second port 32B, 33B which can communicate with the corresponding second opening 31B. The inside of each of the load-lock chambers 32, 33 are shut off from the inside of the vacuum chamber 31 when the second port 32B, 33B communicates with the second opening 31B.

25 Claims, 5 Drawing Sheets

PRIOR ART

LOAD-LOCK MECHANISM AND PROCESSING APPARATUS

FIELD OF THE INVENTION

This invention relates to a load-lock mechanism and a processing unit in a system for processing objects such as wafers as part of a step for processing semiconductor wafers.

BACKGROUND OF THE INVENTION

Current trend of semiconductor processing technology shows a shift from the conventional 6 or 8 inch semiconductor wafers towards to 12 inch wafers. As a result, semiconductor manufacturing systems handling 12 inch wafers are being developed. In 12 inch wafers, the diameter and the weight of the wafers increase and all kinds of the systems related to semiconductor manufacturing become larger in size than they are now.

Figure 6:
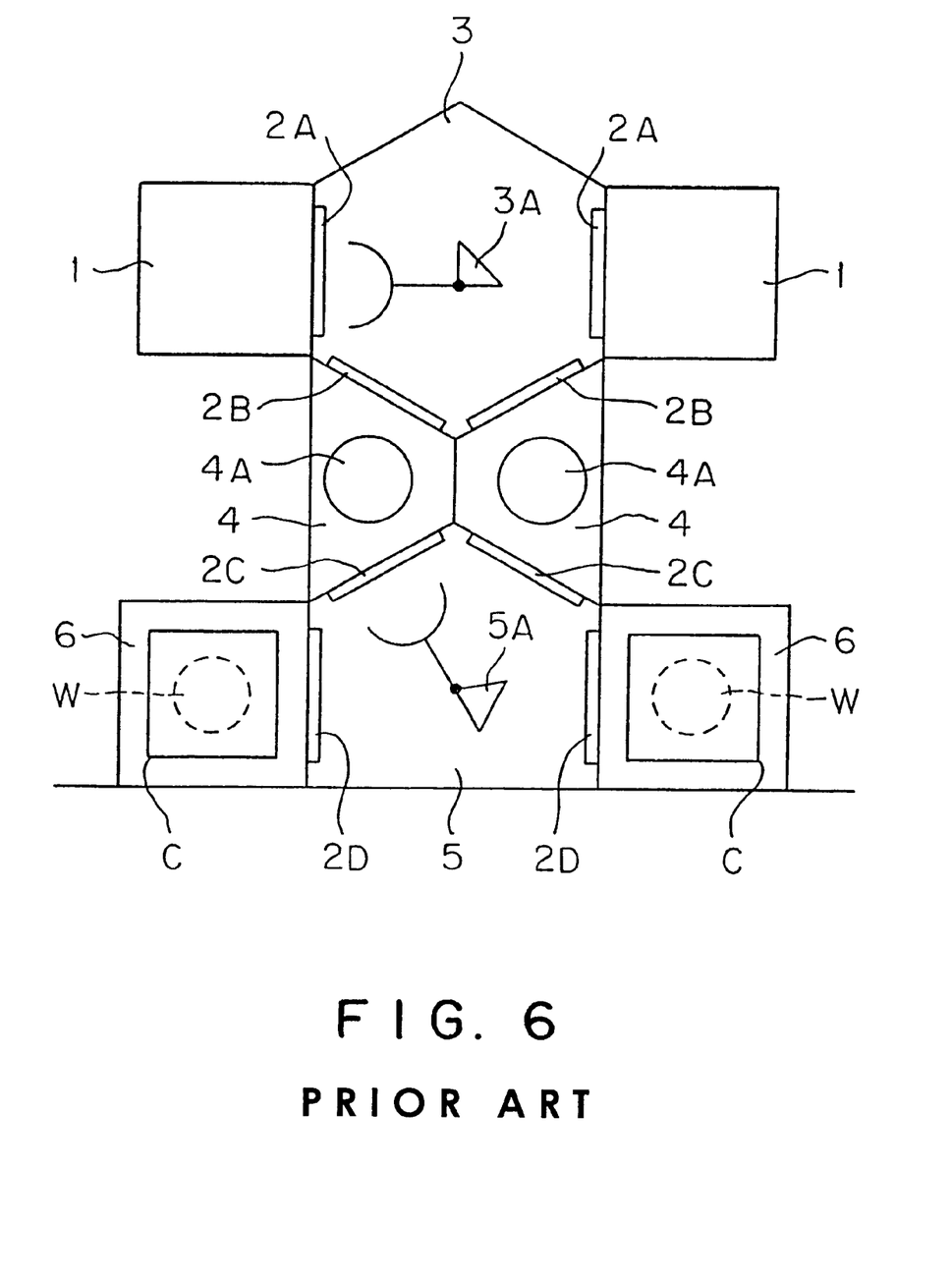
FIG. 6 is a plan view of a conventional processing unit.

For example, FIG. 6 shows in plan view an example of multi-chamber processing units which can conduct plural processes one after another. The processing unit is maintained at a set vacuum. The processing unit comprises; plural processing chambers 1 each of which can conduct etching, film forming or the like on the wafers W, and a first transferring chamber 3 which can be connected to and disconnected from each of the processing chambers 1 through a gate-valve 2A and which can transfer wafers W one by one in a vacuum corresponding to the vacuum in each of the processing chambers 1. The processing unit further comprises two juxtaposed load-lock chambers 4 each of which can be connected to and disconnected from the transferring chambers 3 through a gate-valve 2B and which can be brought into a vacuum corresponding to the vacuum in the transferring chambers 3, a second transferring chamber 5 which can be connected to and disconnected from each of the load-lock chambers 4 through a gate-valve 2C and which can transfer wafers W one by one in an atmospheric pressure, and a carrier-housing chamber 6 which can be connected to and disconnected from the second transferring chamber 5 through a gate-valve 2D and which can house a carrier C for wafers W. The wafer-transferring devices 3A, 5A are respectively arranged in the first and second transferring chambers 3 and 5. Each of the devices 3A, 5A has a handling arm which can transfer wafers W one by one. The reference sign 4A in FIG. 6 indicates a temperature controlled mounting stand for mounting a wafer W. The stand 4A forms a load-lock mechanism together with the load-lock chamber 4, and maintains the wafer W at a certain temperature.

When conducting a process on the wafer W in the left carrier-housing chamber 6, the gate-valve 2D is opened, the wafer-transferring device 5A in the second transferring chamber is driven to take the wafer W out of the carrier C in the carrier-housing chamber 6, and the gate-valve 2D is closed to shut off the carrier-housing chamber 6 from the second transferring chamber 5. Then the gate-valve 2C of the left load-lock chamber 4 is opened, the wafer-transferring device 5A transfers the wafer W from the second transferring chamber 5 onto the stand 4A in the load-lock chamber 4, and the gate-valve 2C is closed. Then a vacuum-making device (not shown in drawings) in the load-lock chamber 4 is operated to bring the load-lock chamber 4 into a vacuum. After the load-lock chamber 4 is brought into a vacuum and the wafer are brought to an appropriate temperature, the gate-valve 2B is opened, the wafer-transferring device 3A in the first transferring chamber 3 is driven to transfer the wafer W in a vacuum from the load-lock chamber 4 into the first transferring chamber 3 and the gate-valve 2B is closed. Next the gate-valve 2A of the left processing chamber 1 is opened, the wafer-transferring device 3A transfers wafer W from the first transferring chamber 3 into the processing chamber 1, the gate-valve 2A is closed and the wafer W is subjected to an appropriate process such as film forming in the processing chamber 1. During the process, other wafers W undergo other processes such as etching in another processing chamber 1.

After the wafer W has finished undergoing the processing in the right processing chamber 1, the gate-valve 2A is opened and the processed wafer W is transferred into the first transferring chamber 3. Next the gate-valve 2B of the right load-lock chamber 4 which has been brought into a vacuum is opened, the wafer-transferring device 3A transfers the processed wafer W into the load-lock chamber 4 and the gate-valve 2B is closed. Then the load-lock chamber 4 is brought back into atmospheric pressure, the gate-valve 2C is opened and the processed wafer W in the load-lock chamber 4 is transferred back into the carrier C in the left carrier-housing chamber 6 through the second transferring chamber 5. During the transferring, other wafers W which have finished undergoing the processing in the left processing chamber 1 and are transferred into the right processing chamber 1 via the wafer-transferring device 3A in the first transferring chamber 3. At the same time, a wafer W to be processed next are taken out of the left carrier-housing chamber 6, and transferred through the left load-lock chamber 4 into the left processing chamber 1 where they undergo an appropriate process such as film forming.

In the above conventional processing unit, the two juxtaposed load-lock chambers 4 are arranged to serve as the connection between the vacuum area and the atmospheric area. Thus, the improvement in the "through-put" (productivity) of the unit is achieved by increasing the efficiency of transferring the wafers W, that is, by effectively using each of the load-lock chambers 4.

The drive mechanism of the wafer-transferring device 3A in the first transferring chamber 3 must be reduced as much as possible in order to minimize the amount of produced particles. Because of this, in the conventional processing units, two load-lock chambers 4 are arranged side by side so that the handling arm in the wafer-transferring device 3A can only move horizontally at the same transferring height without moving vertically. This results in the problem of the footprints of the load-lock chambers 4 being large. Furthermore, if wafers W are 12 inch in size, the arrangement of the two juxtaposed load-lock chambers 4 greatly restricts the layout of the processing chambers 1 because the wiring becomes in more layers and the number of the processes in the processing unit, that is, the number of the processing chambers 1 increases.

SUMMARY OF THE INVENTION

The object of this invention is to provide a load-lock mechanism and a processing unit which can reduce its footprint to reduce the restrictions on the layout of the processing chambers.

To achieve the above object, this invention is characterized by a feature in that a load-lock mechanism comprising; a vacuum chamber placed between a vacuum area and an atmospheric area, having a first opening facing the vacuum area, at least one pair of second openings facing the atmospheric area, and open-close mechanisms to open and close each of the second openings, at least one pair of load-lock chambers movably housed in the vacuum chamber, a supply-discharge mechanism to supply and discharge air into or out of each of the load-lock chambers, wherein each of the load-lock chamber has a first port which can communicate with the first opening, a second port which can communicate with the corresponding second opening, and a closing mechanism to shut off an interior of the load-lock chamber from an inside of the vacuum chamber when the second port communicates with the second opening.

Preferably, the first port and the second port are formed in the same horizontal plane.

Preferably, each of the load-lock chambers can be moved vertically in the vacuum chamber. In particular, a pair of the load-lock chambers are arranged vertically, the vacuum chamber has two second openings at an upper part and at a lower part, and each of the second ports can communicate with the corresponding second opening of each of the load-lock chambers, respectively.

Preferably, the supply-discharge mechanism has a passageway provided in the vacuum chamber to connect with the first port when the second port communicates with the corresponding second opening. Otherwise, it is preferable that the load-lock chamber has a supply-discharge port, and the supply-discharge mechanism has a way provided in the vacuum chamber-to communicate with the supply-discharge opening when the second port communicates with the corresponding second opening.

Furthermore, preferably, an elevating means is provided on a bottom surface of the load-lock chamber for supporting and vertically elevating an object to be processed.

Furthermore, preferably, a cooling means is provided on a bottom surface of the load-lock chamber for cooling an object to be processed when the object to be processed is housed in the inside of the load-lock chamber.

BEST MODE FOR CARRYING OUT THE INVENTION

Embodiments of the invention will now be described in more detail with reference to FIG. 1 to FIG. 5.

Figure 1:
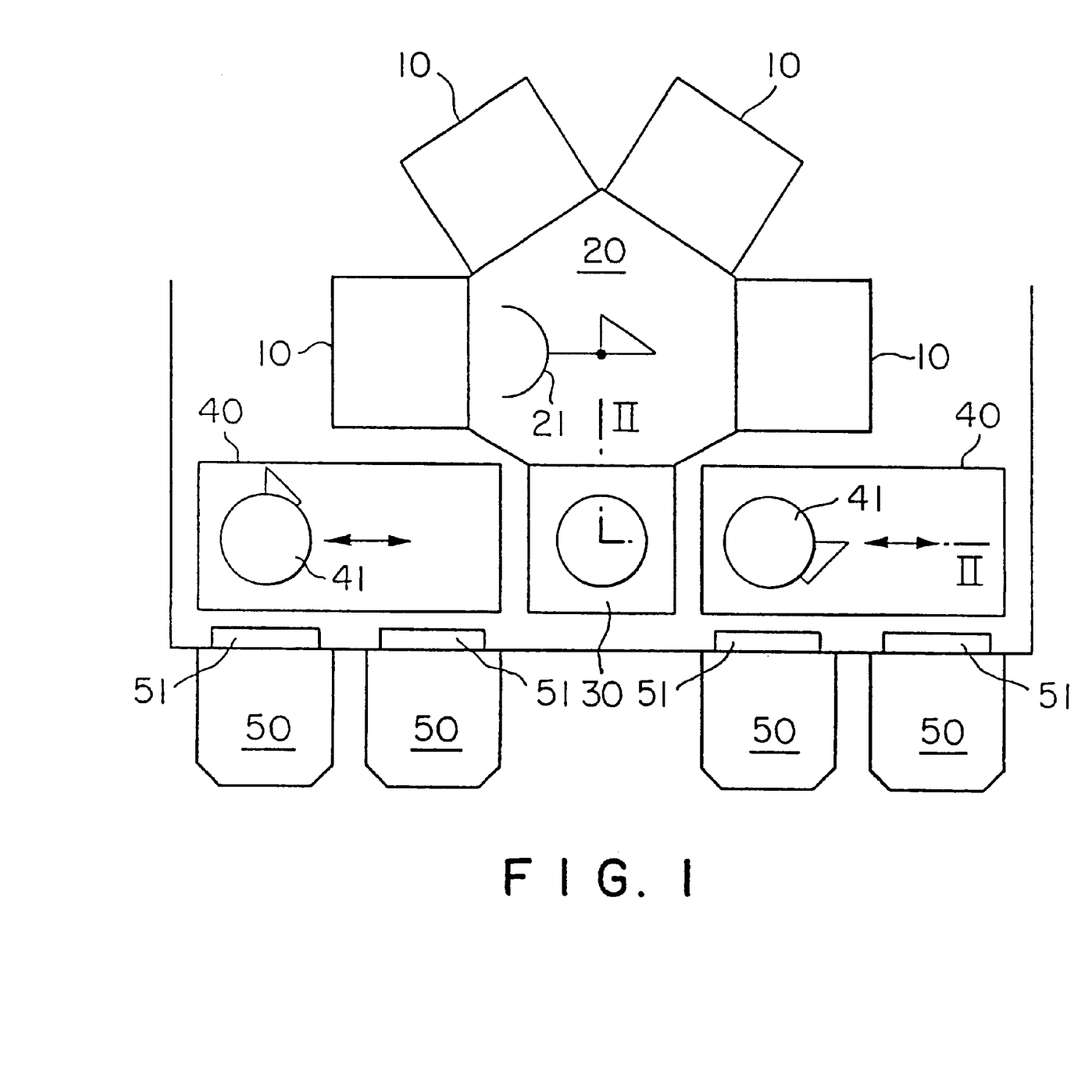
FIG. 1 is a plan view of an embodiment of the processing unit according to the invention.
Figure 2:
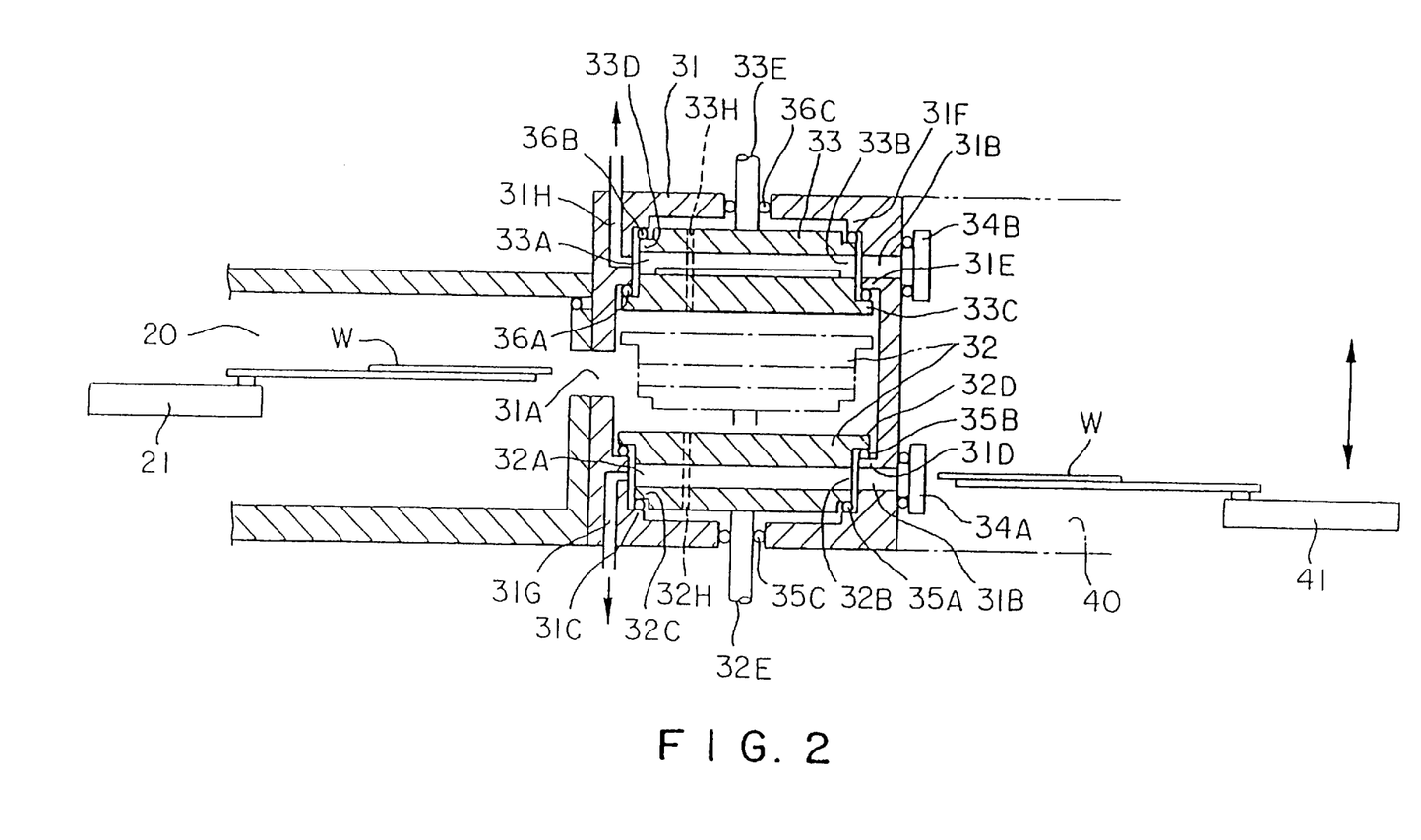
FIG. 2 is a sectional view of a processing unit in FIG. 1 taken along a II—II line.

A first embodiment of the multi-chamber processing unit according to the invention comprises; as shown in FIG. 1, plural (four in FIG. 1) processing chambers 10 which can successively conduct processes such as etching and film forming on the wafers, a polygonal first transferring chamber 20 which can be connected to and disconnected from each of the processing chambers 10 through each gate-valve (not shown), a load-lock mechanism 30 which is connected with the first transferring chamber 20, second transferring chambers 40 which can be connected to and disconnected from each of the left wall and the right wall of the load-lock mechanism 30 through each later-described gate-valve, plural (four in FIG. 1) juxtaposed carrier-housing chambers 50 which can be connected to and disconnected from each of the second transferring chambers 40 through each gate-valve 51. Wafer-transferring devices 21 and 41 are respectively arranged in the first and second transferring chamber 20 and 40 for transferring wafers W one by one. As shown in FIG. 1, this embodiment of the processing unit comprises only one load-lock mechanism 30, so that its footprint can be reduced compared with the conventional unit and the restriction to the layout of the processing chambers 10 can be relaxed. FIG. 2 shows mainly the load-lock mechanism 30 in detail. FIG. 2 is a sectional view of FIG. 1 taken along a II—II line.

With reference to the FIG. 2, the load-lock mechanism 30 of this embodiment will be described in more detail. The load-lock mechanism 30 comprises a rectangular vacuum chamber 31, which connects the first transferring chamber 20 transferring wafers in a vacuum and the second transferring chambers 40 transferring wafers under the atmospheric pressure. That is, three side walls of the vacuum chamber 31 are respectively connected with the first and second transferring chambers 20 and 40. In the vacuum chamber 31, a pair of first and second load-lock chambers 32 and 33 are arranged vertically. A first opening 31A is formed in the vertically middle part of the side wall dividing the vacuum chamber 31 and the first transferring chamber 20. Second openings 31B are respectively formed at upper parts and lower parts of both of the left and the right side walls dividing the vacuum chamber 31 and the second transferring chambers 40.

Each of the first and second load-lock chambers 32 and 33 can be moved vertically in the vacuum chamber 31 while maintaining the inside of each chamber airtight. The inside of each of the first and second load-lock chambers 32, 33 is formed as a space for housing the wafers W. Each inside openly connects to the first transferring chamber 20 at each first port 32A or 33A in the side wall and openly connects to the second transferring chambers 40 at each second port 32B or 33B in the left and right side walls. The first port 32A is closed by the side wall of the vacuum chamber 31 when the lower first load-lock chamber 32 is at the lowest position. At the same time, the second port 32B is openly communicated with the corresponding second opening 31B of the vacuum chamber 31. The first port 33A is closed by the side wall of the vacuum chamber 31 when the upper second load-lock chamber 33 is at the highest position. At the same time, the second port 33B is openly communicated with the corresponding second opening 31B of the vacuum chamber 31.

The first and second gate-valves 34A and 34B are respectively attached on the outer sides of the upper and the lower second openings 31B of the vacuum chamber 31. The first load-lock chamber 32 and the second transferring chambers 40 are connected with or disconnected from each other through the gate-valve 34A when the first load-lock chamber 32 is at the lowest position. The second load-lock chamber 33 and the second transferring chambers 40 are also connected with or disconnected from each other through the gate-valve 34B when the second load-lock chamber 33 is at the highest position.

The wafer-transferring device 21 in the first transferring chamber 20 transfers wafers W into and out of the first and the second load-lock chambers 32 and 33 at the same height through the first opening 31A of the vacuum chamber 31, by rotating, bending and stretching the handling arm in one horizontal plane so as to prevent production of particles. The wafer-transferring device 41 in each second transferring chamber 40 has an elevating mechanism and a laterally moving mechanism. Thus, the wafer-transferring device 41 moves up and down between the upper and the lower second openings 31B; rotates, bends and stretches the handling arm in the respective height's horizontal plane; laterally moves the handling arm between carrier-housing chambers 50 facing the second transferring chamber 40 as shown in FIG. 1; and transfers wafers W between the carrier-housing chambers 50 and the first or the second load-lock chambers 32 and 33.

As shown in FIG. 2, the first load-lock chamber 32 located in a lower portion of the vacuum chamber 31 has a flange 32C and a seal-element 35A as an open-close mechanism in the lowest periphery. In the inside wall of the vacuum chamber 31 is formed a step 31C corresponding to the flange 32C. The step 31C and the flange 32C can be fitted airtightly with each other through the seal-element 35A when the first load-lock chamber 32 is at the lowest position. Thus the first load-lock chamber 32 can be shut off from the lower space of the vacuum chamber 31.

The first load-lock chamber 32 has also a flange 32D and a seal-element 35B as a open-close mechanism on the top periphery. In the inside wall of the vacuum chamber 31 is also formed a step 31D corresponding to the flange 32D. The step 31D and the flange 32D can be fitted in an airtight manner with each other through the seal-element 35B when the first load-lock chamber 32 is at the lowest position. Thus the first load-lock chamber 32 can also be shut off from the upper space of the vacuum chamber 31.

The seal-elements 35A and 35B are integral with the first load-lock chamber 32 so that they moves together with the first load-lock chamber 32 when the first load-lock chamber 32 moves vertically in the vacuum chamber 31, but they could be made separately. In the side wall of the first load-lock chamber 32 is formed an air passageway 32H connecting the upper space and the lower space without connecting with the inside.

An elevating rod 32E is connected with the center of the first load-lock chamber 32 on the lower side. The elevating rod 32E extends down from the first load-lock chamber 32, penetrates a hall in the center of the lower part of the vacuum chamber 31 and is connected with an elevating drive mechanism placed below and not shown. Between the elevating rod 32E and the hall is inserted a seal-element 35C so that the elevating rod 32E can move vertically through the hall, maintaining airtightness. The elevating drive mechanism controls the vertical movement of the first load-lock chamber 32 by the elevating rod 32E. When the first gate-valve 34A is opened, the first load-lock chamber 32 becomes the boundary between the atmosphere and the vacuum and receives the lifting force due to the difference in pressure. Therefore, the elevating drive mechanism has to be always given the force against the above lifting force.

The second load-lock chamber 33 has also a flange 33C and a seal-element 36A as a open-close mechanism on the bottom periphery. In the inside wall of the vacuum chamber 31 is formed a step 31E corresponding to the flange 33C. The steps 31E and the flange 33C can be fitted in an airtight manner with each other through the seal-element 36A when the second load-lock chamber 33 is at the highest position. Thus the second load-lock chamber 33 can be shut off from the lower space of the vacuum chamber 31.

The second load-lock chamber 33 has also a flange 33D and a seal-element 36B as a open-close mechanism on the top periphery. In the inside wall of the vacuum chamber 31 is also formed a step 31F corresponding to the flange 33D. The step 31F and the flange 33D can be fitted airtightly with each other through the seal-element 36B when the second load-lock chamber 33 is at the highest position. Thus the second load-lock chamber 33 can also be shut off from the upper space of the vacuum chamber 31.

The seal-elements 36A and 36B are integral with the second load-lock chamber 33 so that they moves together with the second load-lock chamber 33 when the second load-lock chamber 33 moves vertically in the vacuum chamber 31, but they could be made separately. In the side wall of the second load-lock chamber 33 is formed an air passageway 33H connecting the upper space and the lower space without connecting with the inside.

An elevating rod 33E is connected with the center of the second load-lock chamber 33 on the upper side. The elevating rod 33E extends up from the second load-lock chamber 33, penetrates a hall in the center of the upper part of the vacuum chamber 31 and is connected with a elevating drive mechanism placed above and not shown. Between the elevating rod 33E and the hall is inserted a seal-element 36C so that the elevating rod 33E can move vertically in an airtight manner through the hall. The elevating drive mechanism controls the vertical movement of the second load-lock chamber 33 by the elevating rod 33E. When the second gate-valve 34B is opened, the load-lock chamber 33 becomes the boundary between the atmosphere and the vacuum and receives the lowering force due to the difference pressure. Therefore, the elevating drive mechanism has to be always given the force against the above lowering force.

A first supply-discharge passageway 31G and a second supply-discharge passageway 31H are respectively formed as a supply-discharge mechanism at the upper and lower parts of the vacuum chamber 31. Both the passageways 31G and 31H are connected with a vacuum-making device (not shown) to bring the first and second load-lock chambers 32 and 33 into vacuum. For example, the first passageway 31G may open between the step 31C and the step 31D so that the first passageway 31G can face the first port 32A of the first load-lock chamber 32 when the first load-lock chamber 32 is at the lowest position (when the second opening is openly communicated with the second port). Similarly, the second passageway 31H may open between the step 31E and the step 31F so that the second passageway 31H can face the first port 33A of the second load-lock chamber 33 when the second load-lock chamber 33 is at the highest position (when the second opening is openly communicated with the second port).

If each of the load-lock chambers 32 and 33 has a supply-discharge port in the side wall, passageways 31G and 31H may be formed in such a manner that each of the passageways 31G and 31H is openly communicated with the corresponding supply-discharge port when the second port communicates with the corresponding second opening.

Figure 3:
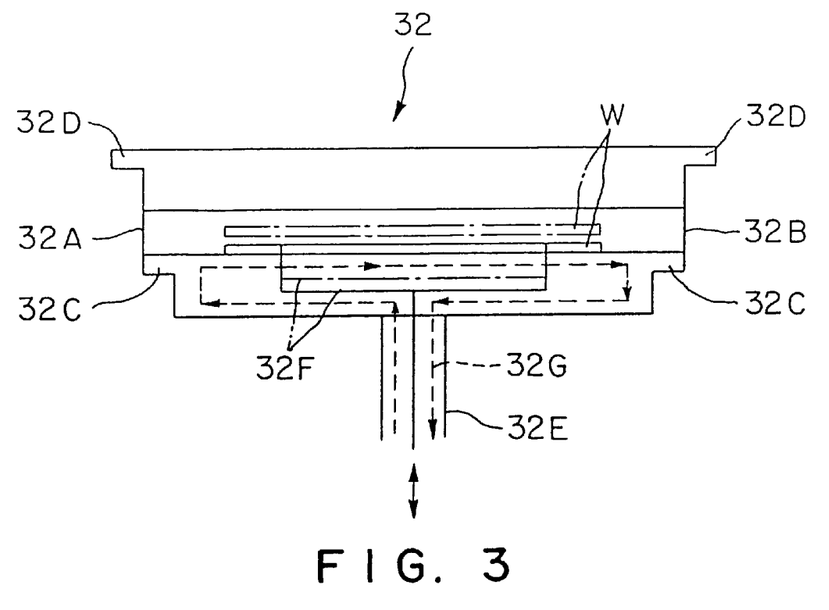
FIG. 3 is an enlarged view of a lower load-lock chamber shown in FIGS. 1 and 2.
Figure 4:
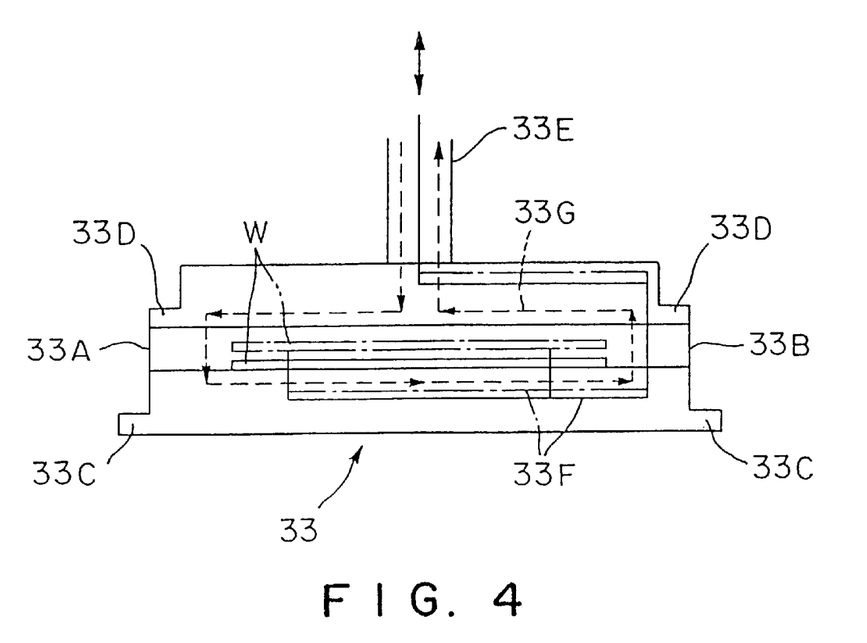
FIG. 4 is an enlarged view of a upper load-lock chamber in FIGS. 1 and 2.

FIGS. 3 and 4 are enlarged views of the first and second load-lock chambers 32 and 33. As shown in these figures, each of the first and second load-lock chambers 32 and 33 has an elevating means on the inside lower surface to support and elevate a wafer W. Each of the first and the second load-lock chambers 32 and 33 has also a temperature controlling means to control the temperature of the wafer W.

In detail, as shown in FIG. 3, the first load-lock chamber 32 has the inside space for housing a wafer W between the upper part and the lower part. The lower part is formed as a stage for the wafer W. A three-pin-lifter 32F is provided as an elevating means in the stage. The three-pin-lifter 32F is connected with an elevating mechanism (not shown) by a pole through the elevating rod 32E. Thus, as shown in FIG. 3, the three-pin-lifter 32F can move vertically between the solid line position and the dot chain line position by the elevating mechanism. At the highest position-(at the dot-chain-line position), the three-pin-lifter 32F protrudes from the stage to lift up the wafer W horizontally. On the other hand, at the lowest position (at the solid line position), the three-pin lifter 32F sinks into the stage to cause the stage to support the wafer W.

In addition, as shown by the broken line in FIG. 3, the temperature controlling means 32G is arranged in the stage without interfering with the three-pin-lifter 32F. The temperature controlling means 32G can maintain the whole upper surface of the stage at the appropriate temperature. The temperature controlling means 32G comprises a cooling means and a heating means. The cooling means may comprise a coolant passage meandering in the stage near the upper surface and a coolant supplier for circulating the coolant through the coolant passage, wherein the wafer W can be cooled entirely equally while the coolant circulates through the coolant passage by the coolant supplier. On the other hand, the heating means may comprise a surface-heater arranged in the stage near the upper surface or a coil-heater meandering in the stage near the upper surface, wherein the wafers W can be heated entirely equally by the surface-heater or the coil heater.

As shown in FIG. 4, the second load-lock chamber 33 has also the inside space for housing wafers W between the upper part and the lower part. The lower part is formed as a stage for the wafer W. A three-pin-lifter 33F is formed as an elevating means in the stage. The three-pin-lifter 33F is connected with an elevating mechanism (not shown) by a pole through the upper part of the second load-lock chamber 33 and through the elevating rod 33E. Thus, as shown in FIG. 4, the three-pin-lifter 33F can move vertically between the solid line position and the dot chain line position by the elevating mechanism. At the highest position (at the dot-chain-line position), the three-pin-lifter 32F protrudes from the stage to lift up the wafer W horizontally. On the other hand, at the lowest position (at the real line position), the three-pin lifter 32F sinks into the stage to cause the stage to support the wafer W.

As shown by the broken line in FIG. 4, the temperature controlling means 33G is arranged in the stage without interfering with the three-pin-lifter 33F. The temperature controlling means 33G can maintain the whole upper surface of the stage at the appropriate temperature. The temperature controlling means 33G comprises a cooling means and a heating means, similarly to the temperature controlling means 32G.

With reference to FIG. 1 to FIG. 4, the operation of the processing unit will be explained hereafter. First, the carriers housing an appropriate number of the wafers W to be processed in the processing chamber are housed in the four carrier-housing chambers 50 arranged at the front of the processing unit. Then, the processing unit starts to be operated under the control of a controller, so that the leftmost gate-valve 51 in FIG. 1 opens and the wafer-transferring device 41 in the second transferring chamber 40 moves to the front of the gate-valve 51. Next, the wafer-transferring device 41 is driven to take out one wafer from the carrier by the handling arm. Then, the gate-valve 51 closes and the wafer-transferring device 41 approaches to the side surface of the load-lock mechanism 30. At the same time, in the state in which the vacuum-making device does not act on the first load-lock chamber 32, the lower first gate-valve 34 of the load-lock mechanism 30 is opened. Thus the second port 32B of the first load-lock chamber 32 is communicated with the atmospheric second transferring chamber 40 through the second opening 31B of the vacuum chamber 31.

Next, the wafer-transferring device 41 is driven to transfer a wafer into the center of the stage in the first load-lock chamber 32 by the handling arm. Then, as shown in FIG. 3, three-pin lifter 32F rises up from the solid-line position to the chain-dot-line position to lift the wafer from the wafer-transferring device 41. Then, the handling arm of the wafer-transferring device 41 moves backward from the first load-lock chamber 32 and the first gate-valve 34A is closed to shut off the first load-lock chamber 32 from the atmospheric second transferring chamber 40. At the same time, in the first load-lock chamber 32, the three-pin lifter 32F is moved down to place the wafer on the stage. The upper surface of the stage is maintained at an appropriate temperature by the temperature controlling means 32G, so that the wafer on the stage is controlled at an appropriate temperature. On the other hand, the first transferring chamber 20 and the vacuum chamber 31 are brought into an appropriate vacuum by making a vacuum.

In the state in which the first gate-valve 34A is closed so that the first load-lock chamber 32 is shut off from the atmospheric second transferring chamber 40, the vacuum-making device starts to act on the second load-lock chamber 32, that is, the first load-lock chamber 32 is brought into vacuum through the supply-discharge passageway 31G of the vacuum chamber 31. When the first load-lock chamber 32 is brought into an appropriate vacuum level, the first load-lock chamber 32 rises up from the solid-line position in FIG. 2 to the chain-dot-line position in FIG. 2 while keeping airtightness (keeping the inside vacuum level) by the elevating rod 32E. Owing to this rising, the vacuum space in the first load-lock chamber 32 and the vacuum space in the first transferring chamber 20 are openly communicated. At the highest position, the first port 32A of the first load-lock chamber 32 faces the first opening 31A of the vacuum chamber 31.

Next, the wafer-transferring device 21 in the first transferring chamber 20 takes out the wafer W from the first load-lock chamber 32 and transfers it into an appropriate processing chamber 10, by the handling arm. The processing chamber 10 conducts an appropriate process such as film forming on the wafer W. During the process, the first load-lock chamber 32 is moved down by the elevating rod 32E. At the lowest position, the first port 32A is shut off from the vacuum space in the vacuum chamber 31 and the second port 32B faces to the second opening 31B of the vacuum chamber 31. Then, air is supplied into the first load-lock chamber 32 through the supply-discharge passageway 31G, so that the first load-lock chamber 32 is brought back to an atmospheric pressure. Then, the atmospheric pressure generates a great force to move up the load-lock chamber 32 toward a center of the vacuum chamber 31. However, a portion of the vacuum chamber 31 under the load-lock chamber 32 is always maintained at the same pressure as the center of the vacuum chamber 31 owing to the presence of the air passageway 32H, so that a force to move down the load-lock chamber 32 is also generated. Therefore, as a whole, the great force to move up the load-lock chamber 32 can be reduced. Then, the first gate-valve 34A is opened and the above steps are repeated, that is, a next wafer W is transferred from the second transferring chamber 40 into the processing chamber 10.

After the film forming have been finished in the processing chamber 10, the wafer-transferring device 21 in the first transferring chamber 20 is driven to take out the processed wafer from the processing chamber 10 into the next processing chamber 10 by the handling arm. For example, the next processing chamber 10 conducts etching process on the wafers. Then, the wafer-transferring device 21 transfers a next waiting wafer W from the first load-lock chamber 32 into the vacant processing chamber 10 for film forming. The processing chamber 10 for the film forming conducts film forming on the wafer W. Therefore, wafers W are successively transferred in each processing chamber 10, and each processing chamber 10 conducts each appropriate process on each of the wafers W.

After all the processes on the wafers W have finished in the plural processing chambers 10, in the load-lock mechanism 30, the second load-lock chamber 33 which has already been brought into vacuum is moved down in the vacuum chamber 31 while keeping airtightness (keeping the inside vacuum) by the elevating rod 33E. At the lowest position, the first port 33a of the second load-lock chamber 33 faces the first opening 31A of the vacuum chamber 31, so that the second load-lock chamber 33 communicates with the first transferring chamber 20. At that time, the wafer-transferring device 21 in the first transferring chamber 20 transfers the processed wafer W from the processing chamber 10 into the second load-lock chamber 33 by the handling arm at the same height as transferring the wafer W from the first load-lock chamber 32.

In the second load-lock chamber 33, the three-pin lifter 33F receives wafers W at the highest position, then the three-pin lifter 33F moves down and sinks into the stage to place the wafer W on the stage. On the other hand, the wafers W are brought back to the room temperature by cooling or the like. At the same time, the second load-lock chamber 33 rises by the elevating rod 33E. At the highest position, the first port 33A is shut off from the vacuum space and the second port 33B faces the second opening 31B of the vacuum chamber 31. Next, air is supplied into the second load-lock chamber 33 through the supply-discharge passageway 31H, so that the second load-lock chamber 33 is brought back to the atmospheric pressure. Then, the atmospheric pressure generates a great force to move down the load-lock chamber 33 toward a center of the vacuum chamber 31. However, a portion of the vacuum chamber 31 above the load-lock chamber 32 is always maintained at the same pressure as the center of the vacuum chamber 31 owing to the presence of the air passageway 33H, so that a force to move up the load-lock chamber 32 is also generated. Therefore, as a whole, the great force to move down the load-lock chamber 33 can be reduced. At the same time, the three-pin lifter 33F rises up so that the wafer W is ready to be handed over. Then, the second gate-valve 34B opens and the wafer-transferring device 41 in the second transferring chamber 40 is driven to transfer the processed wafer W in the second load-lock chamber 33 into the original position in the carrier-housing chamber 50 by the handling arm. At that time, a series of the processes on the wafers W are finished.

Other wafers W in another carrier-housing chamber 50 also undergo appropriate processes in sequence by the above steps. When a wafer W are transferring into the second load-lock chamber 33, if it is not necessary to control the temperature of the wafer W, the three-pin lifter 33E is allowed to be maintained at the highest position.

In this embodiment of the processing unit, the load-lock mechanism 30 comprises the vacuum chamber 31 and the first and the second load-lock chambers 32 and 33 arranged vertically and respectively moving vertically in the vacuum chamber 31. Therefore the wafers W can be transferred at the same height through one first opening 31A into and out of the first transferring chamber 20. As a result, the footprints of the load-lock mechanism 30 can be reduced to about as half as those of the conventional mechanism. In addition, the wafers W can be transferred into and out of the first and second load-lock chambers 32 and 33 without changing the structure of the wafer-transferring device 21 in the first transferring chamber 20. That is, if the load-lock mechanism 30 of this embodiment is applied to a processing unit, the footprints of the processing unit can be reduced and the restriction to the layout of the processing chambers 10 can be much relaxed.

In this unit, each of the first and the second load-lock chambers 32 and 33 are adapted to cooperate with each of the supply-discharge passageways 31G, 31H in the vacuum chamber 31. Therefore, if the first and second load-lock chambers 32, 33 are arranged into one vacuum chamber 31, air can be separately supplied into and discharged out of each of the first and second load-lock chambers 32 and 33. As a result, one of the first and second load-lock chambers 32 and 33 can be used only for transferring wafers W into the first transferring chamber 20 and the other of the first and second load-lock chambers 32 and 33 can be used only for transferring wafers W from the first transferring chamber 20. Of course, each of the first and second load-lock chambers 32 and 33 can be used for transferring wafers w both into and out of the first transferring chamber 20.

Each of the first and second load-lock chambers 32 and 33 has an elevating mechanism 32F, 33F for elevating wafers W, so that the wafers W can be smoothly transferred into and out of the first and second load-lock chambers 32 and 33.

Furthermore, each of the first and second load-lock chambers 32 and 33 has a temperature controlling means 32G, 33G for controlling the temperature of the wafers, so that wafers W can be cooled and heated to an appropriate temperature during the transferring.

Figure 5:
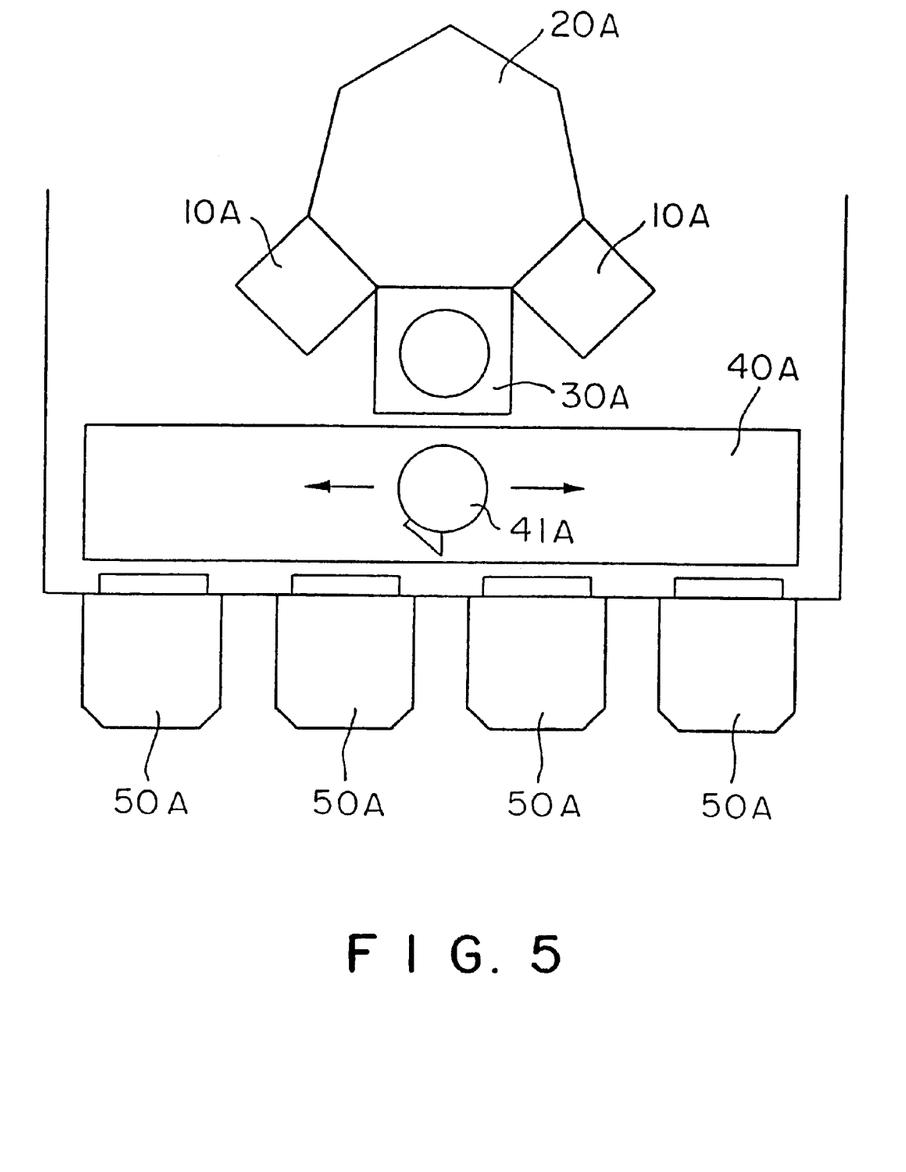
FIG. 5 is a plan view of another embodiment of the processing unit according to the invention.

FIG. 5 shows in plan view another embodiment of the processing unit according to the invention. Under this processing unit, as shown in FIG. 5, more processing chambers 10A than those in the above embodiment are connected with a first transferring chamber 20. As shown in FIG. 5, the processing chambers 10A extend over the left side and the right side of the load-lock mechanism 30A, so that only one second transferring chamber 40A is arranged at the front side of the load-lock mechanism 30A. The processing chamber 10A is arranged to produce semiconductor devices with multi-layered wire structures more efficiently. The other structure is substantially similar to the above embodiment.

In this embodiment of the processing unit, although the footprints are a little larger than those of the above embodiment, wafers W can undergo in sequence more different processes than those by the above embodiment because the number of the processing chambers 10A has increased.

Each of the load-lock chambers 32 and 33 may have a plurality of inside spaces to provide a plurality of substantial load-lock chambers. For example, the first load-lock chamber 32 supported by the rod 32E shown in FIG. 3 may have two or more inside spaces horizontally arranged in a line for housing wafers W respectively. Similarly, the second load-lock chamber 33 supported by the rod 33E shown in FIG. 4 may have two or more inside spaces horizontally arranged in a line for housing wafers W respectively.

In addition, two or more pairs of upper and lower load-lock chambers 32 and 33 may be arranged in a vacuum chamber.

The objects to be processed are not limited to wafers, but could be, for example, glass substrates.

What is claimed is:

1. A load-lock mechanism comprising;
a vacuum chamber placed between a vacuum area and an atmospheric area, having a first opening facing the vacuum area, at least one pair of upper and lower second openings facing the atmospheric area, and open-close mechanisms to open and close each of the second openings;
at least one pair of load-lock chambers arranged vertically in the vacuum chamber, each of which is vertically movable in the vacuum chamber; and
a supply discharge mechanism to supply and discharge air into or out of each of the load-lock chambers;
wherein each of the load-lock chambers has a first port which can communicate with the first opening, a second port which can communicate with the corresponding second opening, and a closing mechanism to shut off an inside of the load-lock chamber from an inside of the vacuum chamber when the second port communicates with the second opening,
one of the pair of load-lock chambers arranged lower in the vacuum chamber has flanges as shutting means at peripheries of a lower surface thereof and an upper end thereof, respectively,
steps are formed at an inside surface of the vacuum chamber correspondingly to the flanges, respectively,
the flange at the lower surface has a diameter smaller than that of the flange at the upper end to pass through an inside of the step corresponding to the flange at the upper end,
the other of the pair of load-lock chambers arranged upper in the vacuum chamber has flanges as shutting means at peripheries of an upper surface thereof and a lower end thereof, respectively,
steps are formed at an inside surface of the vacuum chamber correspondingly to the flanges, respectively, and
the flange at the upper surface has a diameter smaller than that of the flange at the lower end to pass through an inside of the step corresponding to the flange at the lower end.

2. A load-lock mechanism according to claim 1, wherein:
the first port and the second port are formed in a single horizontal plane.

3. A load-lock mechanism according to claim 1, wherein:
the supply-discharge mechanism has a passage way provided in the vacuum chamber to connect with the first port when the second port communicates with the corresponding second opening.

4. A load-lock mechanism according to claim 1, wherein:
the load-lock chamber has a supply-discharge port, and the supply-discharge mechanism has a passage way provided in the vacuum chamber to communicate with the supply-discharge opening when the second port communicates with the corresponding second opening.

5. A load-lock mechanism according to claim 1, wherein:
an elevating means is provided on a bottom surface of the load-lock chamber for supporting and vertically elevating an object to be processed.

6. A load-lock mechanism according to claim 1, wherein:
a cooler is provided on a bottom surface of the load-lock chamber for cooling an object to be processed when the object to be processed is housed in the inside of the load-lock chamber.

7. A load-lock mechanism according to claim 1, wherein:
a heater is provided on a bottom surface of the load-lock chamber for heating an object to be processed when the object to be processed is housed in the inside of the load-lock chamber.

8. A load-lock unit comprising:
a vacuum transferring chamber as a vacuum area; an atmospheric transferring chamber as an atmospheric area;
a vacuum chamber placed between the vacuum transferring chamber and the atmospheric transferring chamber, having a first opening facing the vacuum transferring chamber, at least one pair of upper and lower second openings facing the atmospheric transferring chamber, and open-close mechanisms to open and close each of the second openings;
at least one pair of load-lock chambers arranged vertically in the vacuum chamber, each of which is vertically movable in the vacuum chamber;
a supply-discharge mechanism to supply and discharge air into or out of each of the load-lock chambers;
wherein each of the load-lock chambers has a first port which can communicate with the first opening, a second port which can communicate with the corresponding second opening, and a closing mechanism to shut off an inside of the load-lock chamber from an inside of the vacuum chamber when the second port communicates with the second opening,
one of the pair of load-lock chambers arranged lower in the vacuum chamber has flanges as shutting means at peripheries of a lower surface thereof and an upper end thereof, respectively,
steps are formed at an inside surface of the vacuum chamber correspondingly to the flanges, respectively,
the flange at the lower surface has a diameter smaller than that of the flange at the upper end to pass through an inside of the step corresponding to the flange at the upper end,
the other of the pair of load-lock chambers arranged upper in the vacuum chamber has flanges as shutting means at peripheries in the vacuum chamber has flanges as shutting means at peripheries of an upper surface thereof and a lower end thereof, respectively, and
steps are formed at an inside surface of the vacuum chamber correspondingly to the flanges, respectively, and
the flange at the upper surface has a diameter smaller than that of the flange at the lower end.

9. A load-lock unit according to claim 8, wherein:
the first port and the second port are formed in a single horizontal plane.

10. A load-lock unit according to claim 8, wherein:
the supply-discharge mechanism has a passage way provided in the vacuum chamber to connect with the first port when the second port communicates with the corresponding second opening.

11. A load-lock unit according to claim 8, wherein:
the supply-discharge mechanism has a passage way provided in the vacuum chamber to communicate with the supply-discharge opening when the second port communicates with the corresponding second opening.

12. A load-lock unit according to claim 8, wherein:
an elevating means is provided on a bottom surface of the load-lock chamber for supporting and vertically elevating an object to be processed.

13. A load-lock unit according to claim 8, wherein:
a cooling means is provided on a bottom surface of the load-lock chamber for cooling an object to be processed when the object to be processed is housed in the inside of the load-lock chamber.

14. A load-lock unit according to claim 8, wherein:
a heater is provided on a bottom surface of the load-lock chamber for heating an object to be processed when the object to be processed is housed in the inside of the load-lock chamber, to pass through an inside of the step corresponding to the flange at the lower end.

15. A load-lock mechanism comprising;
a vacuum chamber placed between a vacuum area and an atmospheric area, having a first opening facing the vacuum area, at least one pair of upper and lower second openings facing the atmospheric area, and open-close mechanisms to open and close each of the second openings;
at least one pair of load-lock chambers arranged vertically in the vacuum chamber, each of which is vertically movable in the vacuum chamber; and
a supply-discharge mechanism to supply and discharge air into or out of each of the load-lock chambers;
wherein each of the load-lock chambers has a first port which can communicate with the first opening, a second port which can communicate with the corresponding second opening, and a closing mechanism to shut off an inside of the load-lock chamber from an inside of the vacuum chamber when the second port communicates with the second opening, and is adapted to house only one wafer.

16. A load-lock mechanism according to claim 15, wherein:
an elevating means is provided on a bottom surface of the load-lock chamber for supporting and vertically elevating an object to be processed.

17. A load-lock mechanism according to claim 15, wherein:
the first port and the second port are formed in a single horizontal plane.

18. A load-lock mechanism according to claim 15, wherein:
the supply-discharge mechanism has a passage way provided in the vacuum chamber to connect with the first port when the second port communicates with the corresponding second opening.

19. A load-lock mechanism according to claim 15, wherein:
the load-lock chamber has a supply-discharge port, and the supply-discharge mechanism has a passage way provided in the vacuum chamber to communicate with the supply-discharge opening when the second port communicates with the corresponding second opening.

20. A load-lock mechanism according to claim 15, wherein:
a cooler is provided on a bottom surface of the load-lock to be processed is housed in the inside of the load-lock chamber.

21. A load-lock mechanism according to claim 15, wherein:
a heater provided on a bottom surface of the load-lock chamber for heating an object to be processed when the object to be processed is housed in the inside of the load-lock chamber.

22. A processing unit comprising;
a vacuum transferring chamber as a vacuum area; an atmospheric transferring chamber as an atmospheric area;
a vacuum chamber placed between the vacuum transferring chamber and the atmospheric transferring chamber, having a first opening facing the vacuum transferring chamber, at least one pair of upper and lower second openings facing the atmospheric transferring chamber, and open-close mechanisms to open and close each of the second openings;
at least one pair of load-lock chambers arranged vertically in the vacuum chamber, each of which is vertically movable in the vacuum chamber;
a supply-discharge mechanism to supply and discharge air into or out of each of the load-lock chambers;
wherein each of the load-lock chambers has a first port which can communicate with the first opening, a second port which can communicate with the corresponding second opening, and a closing mechanism to shut off an inside of the load-lock chamber from an inside of the vacuum chamber when the second port communicates with the second opening, and is adapted to house only one wafer.

23. A processing unit according to claim 22, wherein:
an elevating means is provided on a bottom surface of the load-lock chamber for supporting and vertically elevating an object to be processed.

24. A processing unit according to claim 22, wherein:
the supply-discharge mechanism has a passage way provided in the vacuum chamber to connect with the first port when the second port communicates with the corresponding second opening.

25. A processing unit according to claim 22, wherein:
the load-lock chamber has a supply-discharge port, and the supply-discharge mechanism has a passage way provided in the vacuum chamber to communicate with the supply-discharge opening when the second port communicates with the corresponding second opening.

* * * * *